(12) United States Patent
Ngo et al.

(10) Patent No.: US 6,465,349 B1
(45) Date of Patent: Oct. 15, 2002

(54) NITROGEN-PLASMA TREATMENT FOR REDUCED NICKEL SILICIDE BRIDGING

(75) Inventors: Minh Van Ngo, Fremont; Christy Mei-Chu Woo, Cupertino, both of CA (US); Paul R. Besser, Austin, TX (US); Robert A. Huertas, Hollister, CA (US)

(73) Assignee: Advanced Micro Devices, Ins., Sunnyvale, CA (US)

( * ) Notice: Subject to any disclaimer, the term of this patent is extended or adjusted under 35 U.S.C. 154(b) by 43 days.

(21) Appl. No.: 09/679,372

(22) Filed: Oct. 5, 2000

(51) Int. Cl.[7] ................................................ H01L 21/44

(52) U.S. Cl. ..................... 438/682; 438/303; 438/305

(58) Field of Search ................................ 438/791, 696, 438/721, 744, 234, 303, 682, 305

(56) References Cited

U.S. PATENT DOCUMENTS

| | | | | |
|---|---|---|---|---|
| 5,940,725 A | * | 8/1999 | Hunter et al. | 438/592 |
| 6,235,654 B1 | * | 5/2001 | Ngo et al. | 438/792 |
| 6,242,354 B1 | * | 6/2001 | Thomas | 438/696 |
| 6,261,973 B1 | * | 7/2001 | Musium et al. | 438/775 |
| 6,291,288 B1 | * | 9/2001 | Huang et al. | 438/239 |

* cited by examiner

*Primary Examiner*—Richard Elms
*Assistant Examiner*—Michael K. Luhrs

(57) ABSTRACT

Bridging between nickel silicide layers on a gate electrode and source/drain regions along silicon nitride sidewall spacers is prevented by treating the exposed surfaces of the silicon nitride sidewall spacers with a nitrogen plasma to create a surface region having reduced free silicon. Embodiments include treating the silicon nitride sidewall spacers with a nitrogen plasma to reduce the refractive index of the surface region to less than about 1.95.

15 Claims, 3 Drawing Sheets

NITROGEN-PLASMA TREATMENT FOR REDUCED NICKEL SILICIDE BRIDGING

RELATED APPLICATION

This application contains subject matter similar to subject matter disclosed in U.S. patent applications: Ser. No. 09/679,373, filed on Oct. 5, 2000; Ser. No. 09/679,374, filed on Oct. 5, 2000 now U.S. Pat No. 4,383,880; Ser. No. 09/679,880, filed on Oct. 5, 2000; Ser. No. 09/679,375, filed on Oct. 5, 2000; and Ser. No. 09/679,871, filed on Oct. 5, 2000.

TECHNICAL FIELD

The present invention relates to the fabrication of semiconductor devices, particularly to selfaligned silicide (salicide) technology, and the resulting semiconductor devices. The present invention is particularly applicable to ultra large scale integrated circuit (ULSI) systems having features in the deep sub-micron regime.

BACKGROUND ART

As integrated circuit geometries continue to plunge into the deep sub-micron regime, it becomes increasingly more difficult to accurately form discreet devices on a semiconductor substrate exhibiting the requisite reliability. High performance microprocessor applications require rapid speed of semiconductor circuitry. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various metal silicides have been employed in salicide technology, such as titanium, tungsten, and cobalt. Nickel, however, offers particularly advantages vis-à-vis other metals in salicide technology. Nickel requires a lower thermal budget in that nickel silicide and can be formed in a single heating step at a relatively low temperature of about 250° C. to about 600° C. with an attendant reduction in consumption of silicon in the substrate, thereby enabling the formation of ultra-shallow source/drain junctions.

In conventional salicide technology, a layer of the metal is deposited on the gate electrode and on the exposed surfaces of the source/drain regions, followed by heating to react the metal with underlying silicon to form the metal silicide. Unreacted metal is then removed from the dielectric sidewall spacers leaving metal silicide contacts on the upper surface of the gate electrode and on the source/drain regions. In implementing salicide technology, it was also found advantageous to employ silicon nitride sidewall spacers, since silicon nitride is highly conformal and enhances device performance, particularly for p-type transistors. However, although silicon nitride spacers are advantageous from such processing standpoints, it was found extremely difficult to effect nickel silicidation of the gate electrode and source/drain regions without undesirable nickel silicide bridging and, hence, short circuiting, therebetween along the surface of the silicon nitride sidewall spacers.

Accordingly, there exists a need for salicide methodology enabling the implementation of nickel silicide interconnection systems without bridging between the nickel silicide layers on the gate electrode and the source/drain regions, particularly when employing silicon nitride sidewall spacers on the gate electrode.

DISCLOSURE OF THE INVENTION

An advantage of the present invention is a method of manufacturing a semiconductor device having nickel silicide contacts on a gate electrode and associated source/drain regions without bridging therebetween along insulative sidewall spacers, notably silicon nitride sidewall spacers.

Another advantage of the present invention is a semiconductor device having nickel silicide contacts on a gate electrode and on associated source/drain regions without bridging therebetween along insulative sidewall spacers, particularly silicon nitride sidewall spacers.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon gate electrode, having opposing side surfaces, on a substrate with a gate insulating layer therebetween; forming silicon nitride sidewall spacers on the opposing side surfaces of the gate electrode leaving exposed adjacent surfaces of the substrate; treating the silicon nitride sidewall spacers with a nitrogen plasma; depositing a layer of nickel on the gate electrode and on the exposed substrate surfaces; and heating to react the layer of nickel with underlying silicon to form a layer of nickel silicide on the gate electrode and layers of nickel silicide on the exposed surfaces of the substrate.

Embodiments of the present invention include forming the silicon nitride sidewall spacers with a refractive index of about 1.95 to about 2.02 and treating the silicon nitride spacers in a nitrogen plasma to form a nitrogen-rich/silicon-starved surface layer deficient in unbonded silicon, i.e., deficient in silicon having dangling bonds, at a thickness of about 100 Å to about 400 Å and having a refractive index less than about 1.95. Embodiments of the present invention further include forming an oxide liner on the opposing side surfaces of the gate electrode prior to forming the silicon nitride sidewall spacers, sputter etching in argon before depositing the layer of nickel to remove contamination and forming the nickel silicide layers at a temperature of about 400° C. to about 600° C.

Another aspect of the present invention is a semiconductor device comprising: a gate electrode, having opposing side surfaces and an upper surface, on a semiconductor substrate with a gate insulating layer therebetween; silicon nitride sidewall spacers on the opposing side surfaces of the gate electrode; a layer of nickel silicide on the upper surface of the gate electrode; and a layer of nickel silicide on the substrate surface adjacent each silicon nitride sidewall spacer, wherein each silicon nitride sidewall spacer comprises a surface region having a refractive index less than the remainder of the silicon nitride sidewall spacer. Embodiments of the present invention include a silicon nitride sidewall spacers with a surface region having a refractive index of about 1.95 while the remainder of the silicon nitride sidewall spacer has a refractive index of about 1.98 to about 2.02.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
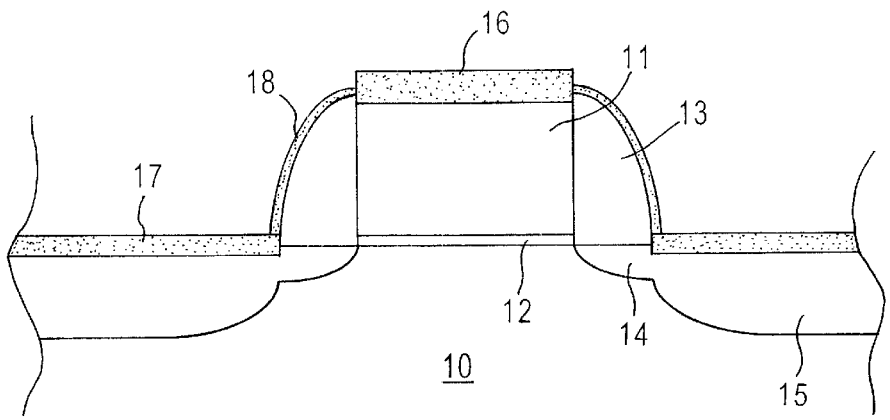
FIG. 1 schematically illustrates problematic nickel silicide bridging attendant upon conventional practices.
Figure 2:
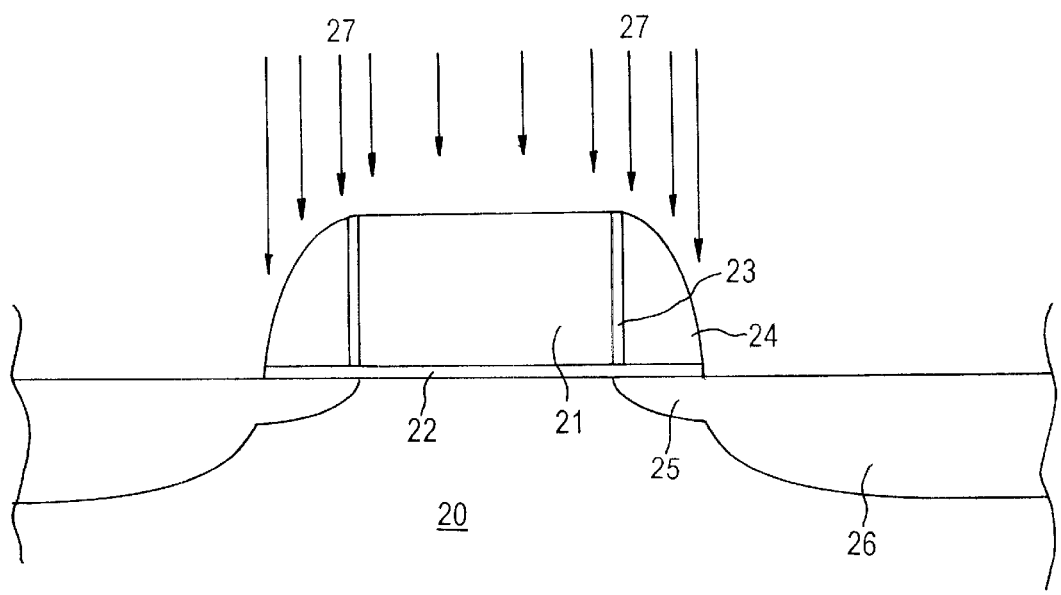
FIGS. 2–5 schematically illustrate sequential phases in accordance with an embodiment of the present invention, wherein like features are denoted by like reference numerals.

The present invention addresses and solves problems attendant upon implementing conventional salicide technology employing nickel as the metal for silicidation. As device geometries shrink into the deep sub-micron regime, nickel silicide bridging occurs along the surface of silicon nitride sidewall spacers between the nickel silicide layer on the gate electrode and nickel silicide layers on associated source/drain regions. For example, adverting to FIG. 1, a gate electrode 11 is formed on substrate 10 with gate insulating layer 12 therebetween. Silicon nitride spacers 13 are formed on opposing side surfaces of gate electrode 11. Shallow source/drain extensions 14 and source/drain regions 15 are formed in substrate 10. A layer of nickel is deposited followed by heating to form a nickel silicide layer 16 on the upper surface of gate electrode 11 and a layer of nickel silicide 17 on associated source/drain regions 15. However, it was found that a thin layer of nickel silicide 18, typically at a thickness of about 30 Å to about 60 Å, is undesirably formed along the exposed surfaces of the silicon nitride sidewall spacers 13 causing bridging and, hence, shorting between nickel silicide layer 16 and nickel silicide layers 17. After considerable experimentation and investigation, it was postulated that the problem of nickel silicide formation 18 along the silicon nitride sidewall spacers 13 stemmed from the reaction of nickel with dangling silicon bonds in the silicon nitride sidewall spacer.

In accordance with embodiments of the present invention, the surface of the silicon nitride sidewall spacers is treated with a nitrogen plasma to decrease the amount of free silicon, i.e., silicon having dangling bonds, on the surface. In other words, treatment of the silicon nitride sidewall spacers in a nitrogen plasma results in the formation of a nitrogen-rich/silicon-starved surface region having less silicon with dangling bonds than the remainder of the silicon nitride sidewall spacer By creating a nitrogen-rich/silicon-starved portion on the surface of the silicon nitride sidewall spacers, reaction between deposited nickel and silicon in the sidewall spacers is reduced, thereby avoiding bridging.

Conventional silicon nitride sidewall spacers exhibit a refractive index of about 1.98 to about 2.02, e.g., about 2. If the amount of silicon with dangling bonds is reduced, the refractive index is also reduced. Accordingly, embodiments of the present invention comprise treating the silicon nitride sidewall spacers in an nitrogen plasma to reduce the number of silicon dangling bonds in a surface region thereof to create a nitrogen-rich/silicon-starved surface region exhibiting a refractive index less than about 1.95, such as about 1.75 to about 1.95, e.g., about 1.85. Such a nitrogen-rich/silicon-starved surface region with reduced silicon dangling bonds and lowered refractive index typically has a thickness of about 100 Å to about 400 Å, e.g., about 300 Å.

Given the disclosed objectives and guidance of the present disclosure, the optimum conditions for plasma treatment of the silicon nitride sidewall spacers can be determined in a particular situation. For example, it was found suitable to treat the silicon nitride sidewall spacers at a nitrogen flow rate of about 6,000 to about 9,000 sccm, a RF power of about 1,500 watts, a pressure of about 2 to about 3 Torr., and a temperature of about 390° C. to about 420° C., typically for about 10 seconds to about 60 seconds. Advantageously, treatment of the surface of the silicon nitride sidewall spacers creates an excess amount of nitrogen such that there is virtually no free silicon available to react with nickel deposited during the subsequent nickel deposition stage. Accordingly, embodiments of the present invention enable nickel silicidation without undesirable bridging, such as that denoted by reference numeral 18 in FIG. 1.

An embodiment of the present invention is schematically illustrated in FIGS. 2 through 5, wherein similar reference numerals denote similar features. Adverting to FIG. 2, a gate electrode 21, e.g., doped polycrystalline silicon, is formed on semiconductor substrate 20, which can be n-type or p-type, with a gate insulating layer 22 therebetween. Gate insulating layer 22 is typically silicon dioxide formed by thermal oxidation or chemical vapor deposition (CVD). In accordance with embodiments of the present invention, a thin oxide liner 23, as at a thickness of about 130 Å to about 170 Å, is formed on the opposing side surfaces of gate electrode 21. Silicon oxide liner can be formed by plasma enhanced chemical vapor deposition (PECVD) using silane at a flow rate of about 50 to about 100 sccm, $N_2O$ at a flow rate of about 1,000 to about 4,000 sccm, an RF power of about 100 watts to about 300 watts, a pressure of about 2.4 Torr. to about 3.2 Torr., and a temperature of about 380° C. to about 420° C., e.g., about 400° C. Silicon oxide liner 23 advantageously prevents consumption of the gate electrode 21 by silicidation from the side surfaces thereof.

Subsequent to forming silicon oxide liner 23, silicon nitride sidewall spacers 24 are formed by depositing a conformal layer followed by anisotropically etching. Silicon nitride sidewall spacers can be formed by PECVD employing a silane flow rate of about 200 to about 400 sccm, e.g, about 375 sccm, a nitrogen flow rate of about 2,000 to about 4,000 sccm, e.g., about 2,800 sccm, an ammonia flow rate of about 2,500 to about 4,000 sccm, e.g., about 3,000 sccm, a high frequency RF power of about 250 watts to about 450 watts, e.g., about 350 watts, a low frequency RF power of about 100 to about 200 watts, e.g., about 140 watts, a pressure of about 1.6 Torr. to about 2.2 Torr., e.g., about 1.9 Torr., and a temperature of about 380° C. to about 420° C., e.g., about 400° C. The silicon nitride sidewall spacers typically have a thickness of about 850 Å to about 950 Å and exhibit a refractive index of about 1.98 to about 2.02, e.g., about 2.0.

Figure 3:
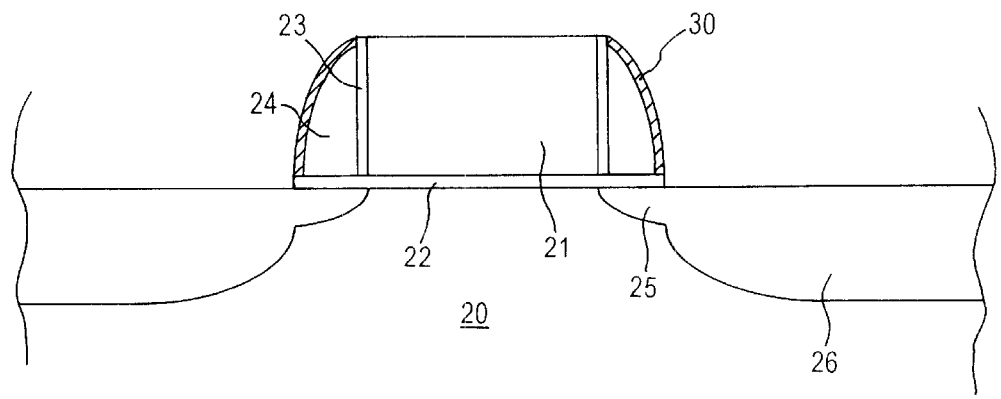
Figure 4:
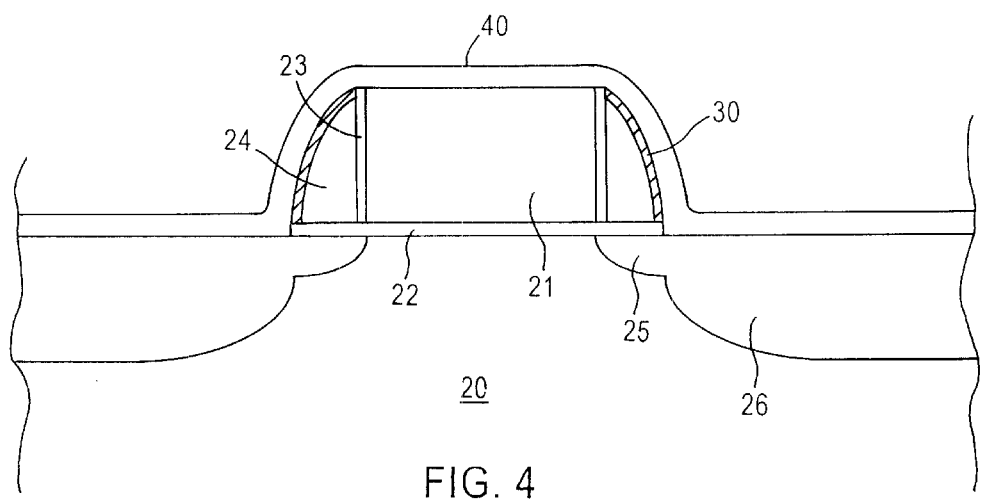

Subsequently, in accordance with embodiments of the present invention, the silicon nitride sidewall spacers 24 are treated in a nitrogen plasma, as illustrated by arrows 27. Treatment in an nitrogen plasma can be conducted at a nitrogen flow rate of about 3,000 to about 9,000 sccm, a temperature of about 380° C. to about 420° C., e.g., about 400° C., a RF power of about 500 watts to about 1,500 watts, e.g., about 1,000 watts, and a pressure of about 2 to about 3 Torr. for about 10 seconds to about 60 seconds. As shown in FIG. 3, treatment of the silicon nitride sidewall spacers 24 with the nitrogen plasma 27 results in the formation of a surface region 30, typically having a thickness of about 100 Å to about 400 Å, e.g., about 300 Å. Surface region 30 vis-à-vis the remainder of the silicon nitride sidewall spacer 24 has a higher nitrogen concentration and lower free silicon concentration. Surface region 30 typically has a refractive index of about 1.75 to about 1.95, e.g., about 1.85 vis-à-vis a refractive index of about 1.98 to about 2.02, e.g., about 2, for the remainder of silicon nitride sidewall spacer 24. Subsequently, a layer of nickel 40 is deposited, as at a thickness of about 100 Å to about 300 Å, e.g., about 200 Å.

Prior to depositing nickel, it was found particularly suitable to conduct argon sputter etching to remove contamination. Sputter etching techniques are conventional and, hence, not set forth herein in detail. Such techniques are typically implemented in an inductively coupled plasma source sputter etch chamber in which a pedestal supports an electrostatic chuck and functions as an RF powered cathode. The chamber walls typically form an RF anode. An electrostatic attractive force is generated by the chuck to retain the wafer in a stationary position during processing. A voltage is applied to one or more electrodes embedded within a ceramic chuck body to induce opposite plurality charges in the wafer and electrodes, respectively The opposite charges pull the wafer against the chuck support surface, thereby electrostatically clamping the wafer. An additional coil in the outside surface of the chamber lid is energized with RF power that inductively couples through the lid and into the chamber. The electric field generated between the anode and cathode along with the inductively coupled power from the coil ionizes a reactment gas introduced into the chamber, e.g., argon, to produce a plasma. Ions from the plasma bombard the wafer to effect etching.

Figure 5:
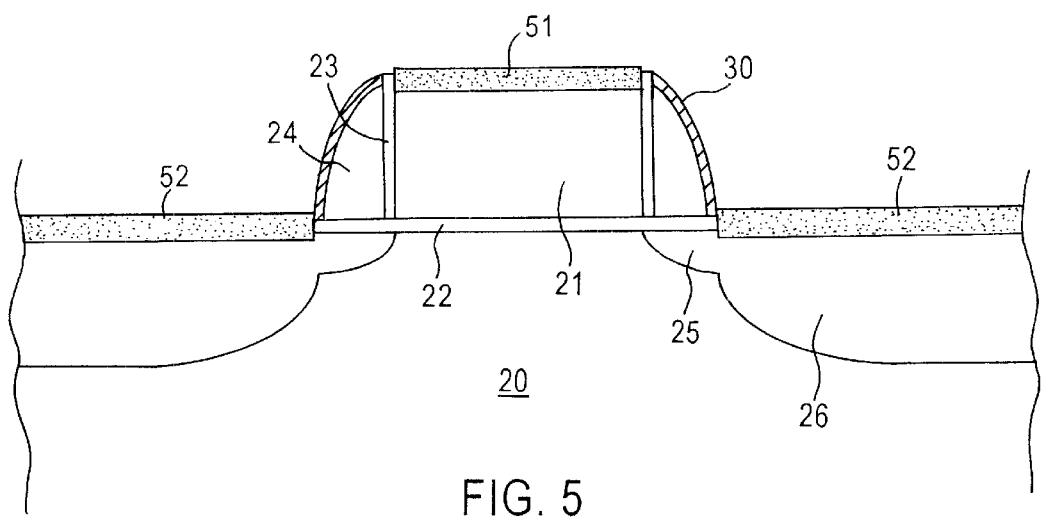

Subsequent to sputter etching, the layer of nickel is deposited followed by rapid thermal annealing, as at a temperature of about 250° C. to about 600° C., e.g., about 400° C. to about 600° C. During such thermal treatment, nickel silicide layer 51, illustrated in FIG. 5, is formed on gate electrode 21 while nickel silicide layers 52 are formed on exposed portions of the substrate adjacent sidewall spacers 24. The nickel silicide layers typically have a thickness of about 100 Å to about 300 Å, e.g., about 200 Å.

The formation of a silicon-starved/nitrogen-rich surface region 30 on silicon nitride sidewall spacers 24 effectively prevents reaction of nickel layer 40 with silicon in sidewall spacers 24, thereby avoiding the formation of nickel silicide thereon and, hence, preventing bridging between nickel silicide layer 51 on the upper surface of gate electrode 21 and nickel silicide layers 52 on the exposed surfaces of the silicon substrate adjacent silicon nitride sidewall spacers 24. In addition, the presence of oxide liner 23 contributes to the prevention of such bridging. Unreacted nickel on the surfaces of the silicon nitride sidewall spacers 24 is then easily removed, as by a wet processing technique, e.g., treating with a mixture of sulfuric acid and hydrogen peroxide with a ratio of sulfuric acid: hydrogen peroxide of about 1:12 to about 1:4, e.g., about 1:2.

The present invention, therefore, enables the implementation of nickel salicide methodology, advantageously utilizing silicon nitride sidewall spacers without bridging between the nickel silicide layer formed on the upper surface of the gate electrode and the nickel silicide layers formed on associated source/drain regions. The present invention is applicable to the production of any of various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
    forming a silicon gate electrode, having opposing side surfaces, on a substrate with a gate insulating layer therebetween;
    forming silicon nitride sidewall spacers on the opposing side surfaces of the gate electrode leaving exposed adjacent surfaces of the substrate;
    treating the silicon nitride sidewall spacers with a nitrogen plasma;
    depositing a layer of nickel on the gate electrode and exposed surfaces of the substrate; and
    heating to react the layer of nickel with underlying silicon to form a layer of nickel silicide on the gate electrode and layers of nickel silicide on the exposed surfaces of the substrate.

2. The method according to claim 1, further comprising:
    treating the silicon nitride sidewall spacers with the nitrogen plasma to reduce the refractive index of an exposed surface, thereby substantially preventing the formation of nickel silicide on the sidewall spacers upon heating to react nickel with the underlying silicon.

3. The method according to claim 2, wherein the formed silicon nitride sidewall spacers have a refractive index of about 1.98 to about 2.02, the method comprising treating the silicon nitride sidewall spacers with the nitrogen plasma to reduce the refractive index of the exposed surface to less than about 1.95.

4. The method according to claim 3, comprising treating the silicon nitride sidewall spacers with the nitrogen plasma to form a surface region having a thickness of about 100 Å to about 400 Å with the refractive index less than about 1.95.

5. The method according to claim 3, comprising treating the silicon nitride sidewall spacers with the nitrogen plasma at a:
    nitrogen flow rate of about 3,000 to about 9,000 sccm;
    RF power of about 500 to about 1,500 watts;
    pressure of about 2 to about 3 Torr.; and
    temperature of about 380° C. to about 420° C.

6. The method according to claim 5, comprising treating the silicon nitride sidewall spacers with the nitrogen plasma for about 10 seconds to about 60 seconds.

7. The method according to claim 2, comprising forming the silicon nitride sidewall spacers at a thickness of about 850 Å to about 950 Å.

8. The method according to claim 2, comprising forming source/drain regions in the substrate proximate the opposing side surfaces of the gate electrode, wherein the nickel silicide layers on the exposed substrate surfaces function as source/drain contacts.

9. The method according to claim 8, comprising forming an oxide liner on the opposing side surfaces of the gate electrode before forming the silicon nitride sidewall spacers.

10. The method according to claim 9, comprising forming the oxide liner at a thickness of about 130 Å to about 170 Å.

11. The method according to claim 9, comprising depositing the layer of nickel at a thickness of about 100 Å to about 300 Å.

12. The method according to claim 9, comprising sputter etching in argon before depositing the layer of nickel.

13. The method according to claim 9, comprising heating at a temperature of about 400° C. to about 600° C. to form the layers of nickel silicide.

14. The method according to claim 9, comprising removing unreacted nickel from the silicon nitride sidewall spacers.

15. The method according to claim 14, comprising removing unreacted nickel from the silicon nitride sidewall spacers with a mixture comprising sulfuric acid and hydrogen peroxide.

* * * * *